(12) United States Patent
    Hatanaka et al.

(10) Patent No.: US 9,709,250 B2
(45) Date of Patent: Jul. 18, 2017

(54) LIGHTING DEVICE FOR MOVING BODY

(71) Applicant: Toshiba Lighting & Technology Corporation, Yokosuka-shi, Kanagawa-ken (JP)

(72) Inventors: Toshihiro Hatanaka, Yokosuka (JP);
    Ryuji Tsuchiya, Yokosuka (JP);
    Kiyokazu Hino, Yokosuka (JP);
    Hiromitsu Shiraishi, Yokosuka (JP)

(73) Assignee: Toshiba Lighting & Technology Corporation, Yokosuka-shi, Kanagawa-ken (JP)

( * ) Notice: Subject to any disclaimer, the term of this patent is extended or adjusted under 35 U.S.C. 154(b) by 107 days.

(21) Appl. No.: 14/721,255

(22) Filed: May 26, 2015

(65) Prior Publication Data
    US 2016/0061424 A1    Mar. 3, 2016

(30) Foreign Application Priority Data
    Sep. 3, 2014   (JP) ................................. 2014-179588

(51) Int. Cl.
    | F21V 19/00 | (2006.01) |
    | H05K 3/00  | (2006.01) |
    | F21S 8/10  | (2006.01) |
    | F21Y 115/30 | (2016.01) |
    | F21Y 115/10 | (2016.01) |

(52) U.S. Cl.
    CPC ......... *F21V 19/005* (2013.01); *F21S 48/1104* (2013.01); *F21S 48/115* (2013.01);
    (Continued)

(58) Field of Classification Search
    CPC ... F21V 19/005; F21S 48/1104; F21S 48/115; F21S 48/211; F21S 48/215; F21S 48/328;
    (Continued)

(56) References Cited

U.S. PATENT DOCUMENTS

2010/0103678 A1*  4/2010  Van De Ven ............. F21K 9/00
                                                    362/294
2011/0096517 A1   4/2011  Yada et al.
(Continued)

FOREIGN PATENT DOCUMENTS

EP    2634797 A1   9/2013
JP    2007-096008 A   4/2007
(Continued)

OTHER PUBLICATIONS

Jan. 18, 2016—(EP) Extended European Search Report—App 15167461.1.
(Continued)

*Primary Examiner* — Andrew Coughlin
*Assistant Examiner* — Glenn Zimmerman
(74) *Attorney, Agent, or Firm* — Banner & Witcoff, Ltd.

(57) ABSTRACT

A lighting device for a moving body includes a substrate that has a base body having connection sections on a side surface and a wiring pattern provided on at least one main surface of the base body. The moving body further includes a light emitting element that is electrically connected to the wiring pattern, and an adhesive section that is provided between the base body and a body section. The connection sections are at least one of groove sections, concave sections, and convex sections, while the adhesive section covers at least a part of the plurality of connection sections.

18 Claims, 5 Drawing Sheets

(52) U.S. Cl.
CPC ........... *F21S 48/211* (2013.01); *F21S 48/215* (2013.01); *F21S 48/328* (2013.01); *H05K 3/0061* (2013.01); *F21Y 2115/10* (2016.08); *F21Y 2115/30* (2016.08); *H05K 2201/09145* (2013.01); *H05K 2201/09154* (2013.01); *H05K 2201/09163* (2013.01); *H05K 2201/10106* (2013.01)

(58) Field of Classification Search
CPC ....... H05K 3/0061; H05K 2201/09145; H05K 2201/09154; H05K 2201/09163; H05K 2201/10106; F21Y 2115/30; F21Y 2101/00
USPC ....................... 362/382, 459; 257/98, 99, 100
See application file for complete search history.

(56) References Cited

U.S. PATENT DOCUMENTS

| | | | | |
|---|---|---|---|---|
| 2011/0180308 | A1* | 7/2011 | Nakamura | H01L 51/5268 174/255 |
| 2011/0248642 | A1* | 10/2011 | Kikuchi | H05B 33/0824 315/250 |
| 2012/0007076 | A1 | 1/2012 | Cho | |
| 2012/0018772 | A1* | 1/2012 | Nishijima | H01L 33/486 257/99 |
| 2013/0027938 | A1* | 1/2013 | Hisayasu | F21V 17/005 362/249.02 |
| 2013/0147348 | A1* | 6/2013 | Motoya | H01L 25/0753 313/512 |
| 2014/0000940 | A1* | 1/2014 | Onitsuka | H01L 23/13 174/251 |
| 2015/0348946 | A1* | 12/2015 | Dohi | H01L 24/97 257/773 |

FOREIGN PATENT DOCUMENTS

| | | | | |
|---|---|---|---|---|
| JP | 2011-253622 A | 12/2011 | | |
| JP | 2013-025935 A | 2/2013 | | |
| JP | WO 2014128796 A1 * | 8/2014 | ........... | H01L 21/561 |
| WO | 2013116114 A1 | 8/2013 | | |
| WO | 2014128796 A1 | 8/2014 | | |

OTHER PUBLICATIONS

Mar. 6, 2017—(JP) Notification of Reasons for Refusal—App 2014-179588.

* cited by examiner

LIGHTING DEVICE FOR MOVING BODY

CROSS-REFERENCE TO RELATED APPLICATIONS

This application is based upon and claims the benefit of priority from Japanese Patent Application No. 2014-179588, filed on Sep. 3, 2014; the entire contents of which are incorporated herein by reference.

FIELD

Exemplary embodiments described herein relate to a lighting device for a moving body.

BACKGROUND

There is a lighting device for a moving body having a substrate on which a Light Emitting Diode (LED) is provided and a body section to which the substrate is bonded.

Vibration along with movement is applied to the lighting device for a moving body.

Furthermore, thermal stress or thermal deformation (expansion and contraction due to a temperature change) occurs in the substrate by turning on and turning off of the LED.

In this case, in a lighting device for a vehicle such as an automobile, a large change in an ambient temperature is (for example, a range from −40° C. to +85° C.) applied and an influence of the thermal deformation is further increased. Therefore, the substrate is likely to peel off from the body section.

Thus, development of a technique that can improve adhesion strength between the substrate and the body section has been desired.

DETAILED DESCRIPTION

A lighting device for a moving body according to an exemplary embodiment includes a substrate that has a base body having a plurality of connection sections on a side surface and a wiring pattern provided on at least one main surface of the base body; a light emitting element that is electrically connected to the wiring pattern; and an adhesive section that is provided between the base body and a body section.

The connection sections are at least one of groove sections, concave sections, and convex sections.

The adhesive section covers at least a part of the plurality of connection sections.

In this lighting device for the moving body, it is possible to increase a contact area between the base body and the adhesive section. If the contact area can be increased, a physical bonding such as van der Waals force or a chemical bonding can be increased. Thus, it is possible to improve adhesion strength between the substrate and the body section.

Furthermore, since a part of the adhesive section can enter the inside of the connection sections, it is possible to increase mechanical connection.

Thus, it is possible to improve the adhesion strength between a substrate 2 and a body section 10.

In this case, the plurality of connection sections may be provided on each of a pair of facing side surfaces.

Thus, it is possible to equal an adhesive force at symmetrical positions with respect to a center of the substrate.

As a result, even if the number of side surfaces on which the connection sections are provided is reduced, it is possible to maintain a resistance force against the vibration and thermal stress.

Furthermore, the base body may further have an inclined surface of which one end portion is connected to the main surface of the base body on which the light emitting element is provided, the other end is connected to the side surface, and which is inclined in a direction close to a center of the base body as the inclined surface goes toward a side of the base body on which the light emitting element is provided.

Then, the adhesive section may cover at least a part of the inclined surface.

Thus, it is possible to increase the resistance force against a force to peel the substrate upward.

Furthermore, the base body may further have a plurality of concave sections opening to the main surface on a side of the base body on which the light emitting element is provided and to the side surface.

Then, the adhesive section may enter at least a part of the plurality of concave sections.

Thus, it is possible to increase the resistance force against a force to peel the substrate upward.

Hereinafter, an exemplary embodiment will be described with reference to the drawings. Moreover, the same reference numerals are given to the same configuration elements in each drawing and detailed description will be appropriately omitted.

Furthermore, a lighting device 1 for a moving body that is illustrated below can be a lighting device provided on a moving body such as an automobile, a railway vehicle, an aircraft, and a ship.

For example, the lighting device 1 for the moving body can be a rear fog lamp of the automobile, a position lamp (car width lamp), a number lamp, a back lamp, a stop lamp, a tail lamp (taillight), a blinker (direction indicator), an interior light, a lighting device for display or signal, and the like. However, use of the lighting device 1 for the moving body is not limited to the examples.

Figure 1:
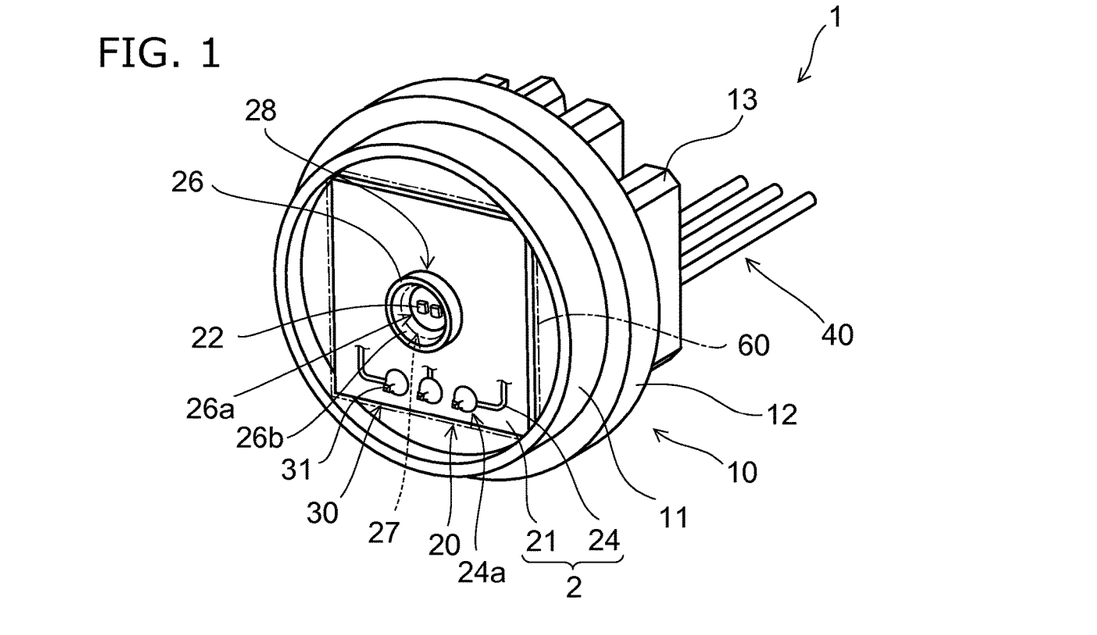
FIG. 1 is a schematic perspective view of a lighting device for a moving body according to an embodiment.
Figure 2:
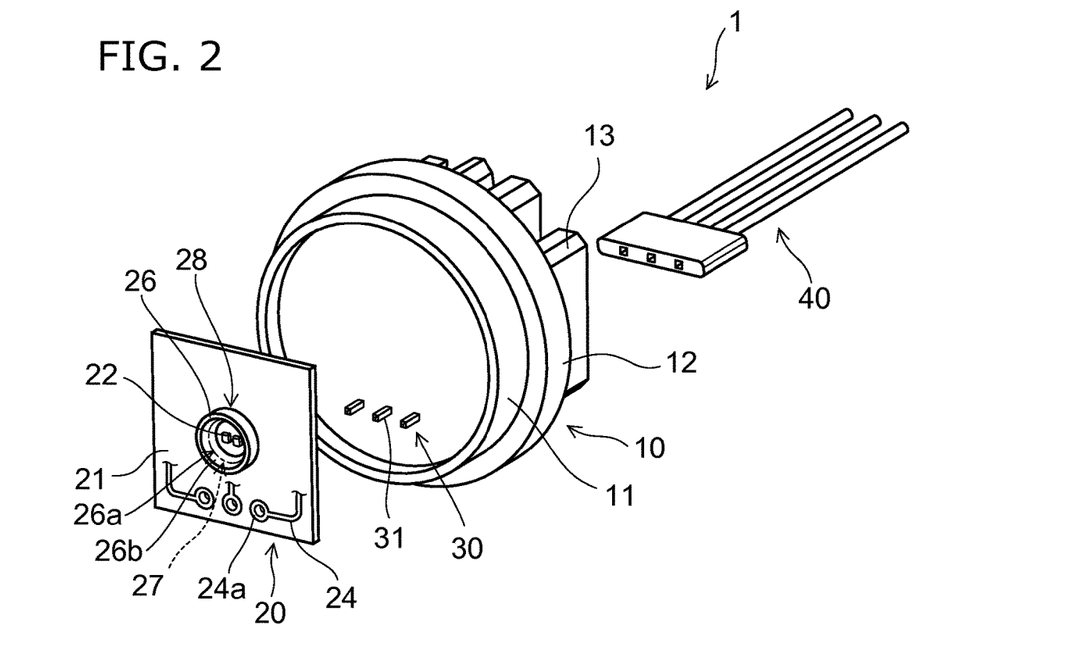
FIG. 2 is a schematic perspective exploded view of the lighting device for the moving body according to the embodiment.
Figure 3:
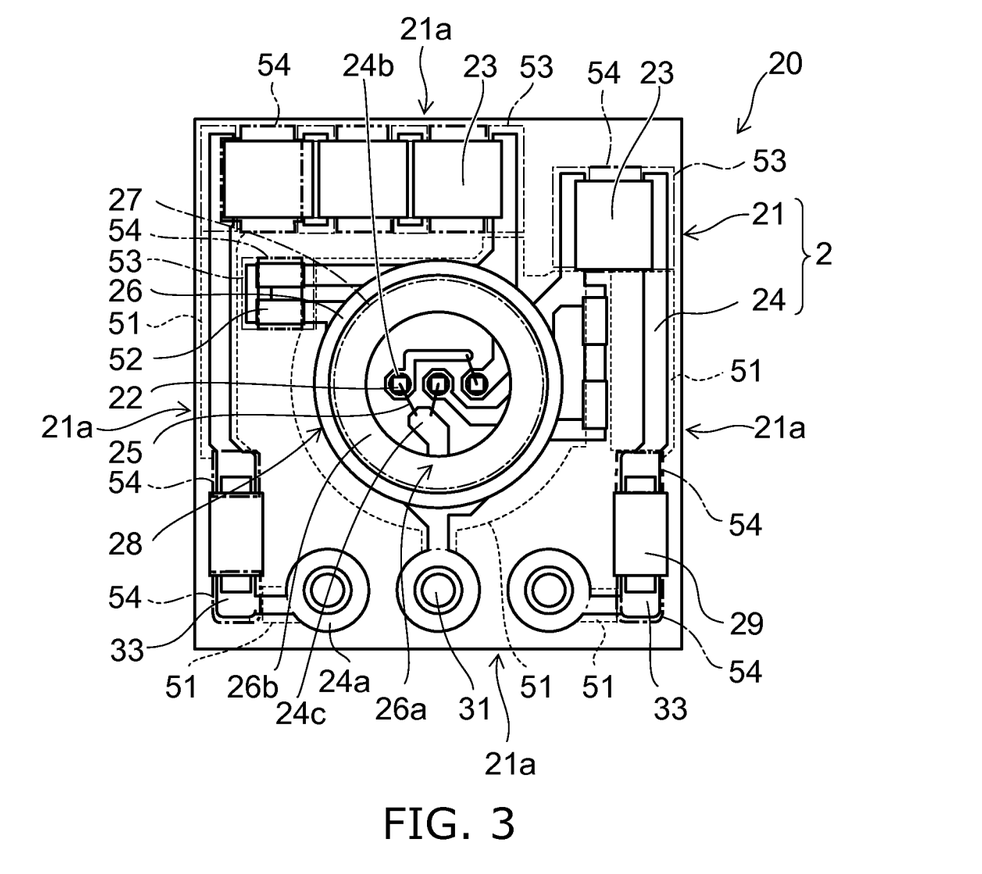
FIG. 3 is a schematic plan view of a light emitting module.

FIG. 1 is a schematic perspective view of the lighting device 1 for the moving body according to an embodiment. FIG. 2 is a schematic perspective exploded view of the lighting device 1 for the moving body according to the embodiment. FIG. 3 is a schematic plan view of a light emitting module 20.

As illustrated in FIGS. 1 and 2, the lighting device 1 for the moving body is provided with a body section 10, the light emitting module 20, a power feeding section 30, a socket 40, and an adhesive section 60.

The body section 10 is provided with a housing section 11, a flange section 12, and fins 13. The housing section 11 has a cylindrical shape and protrudes from one surface of the flange section 12. The light emitting module 20 is housed inside of the housing section 11. Furthermore, power feeding terminals 31 of the power feeding section 30 protrude on the inside of the housing section 11.

The flange section 12 has a disk shape, the housing section 11 is provided in one surface, and the fins 13 are provided on the other surface.

A plurality of fins 13 are provided to protrude from the surface of the flange section 12. The plurality of fins 13 have a plate shape and function as radiating fins.

The body section 10 has a function for housing the light emitting module 20, the power feeding section 30, and the like, and a function for radiating heat generated by the light emitting module 20 or the power feeding section 30 to the outside the lighting device 1 for the moving body.

Thus, the body section 10 can be formed of a material having high thermal conductivity considering heat to be discharged to the outside. For example, the body section 10 can be formed of aluminum, aluminum alloy, a high thermal conductivity resin, and the like. For example, the high thermal conductivity resin is obtained by mixing fibers or particles of carbon, aluminum oxide, and the like having the high thermal conductivity into a resin such as PET or nylon.

In this case, a portion where heat from the fins 13 and the like is radiated to the outside is formed of the material having high thermal conductivity and the other portions can be formed of a resin and the like.

Furthermore, if a main portion of the body section 10 is formed by using a conductive material, in order to ensure electrical insulation between the power feeding terminals 31 and a portion of the body section 10 formed of the conductive material, a periphery of the power feeding terminals 31 is covered with an insulation material and the portion formed of conductive material may be disposed on the periphery thereof. For example, the insulation material is a resin and the like, the material having high thermal conductivity is desirable.

Furthermore, the body section 10 may be provided with a mounting section (not illustrated) that is used when the lighting device 1 for the moving body is mounted on a lighting apparatus for the vehicle.

As illustrated in FIG. 3, the light emitting module 20 is provided with a substrate 2, a light emitting element 22, a control element 23, wiring 25, a surrounding wall member 26, a sealing section 27, an adhesive section 28, a control element 29, a coating section 51, a control element 52, a coating section 53, and a coating section 54.

Furthermore, the substrate 2 is provided with a base body 21 and wiring pattern 24.

The base body 21 is on the inside of the housing section 11 of the body section 10 and is bonded to the flange section 12 through the adhesive section 60.

That is, the base body 21 is provided on the flange section 12.

The base body 21 has a plate shape and the wiring pattern 24 is provided on the main surface.

Furthermore, a plurality of connection sections 121 are provided on a side surface 21a of the base body 21.

Moreover, the connection sections 121 will be described below in detail.

The material or structure of the base body 21 is not specifically limited. For example, the base body 21 can be formed of an inorganic material (ceramic) such as aluminum oxide or aluminum nitride, an organic material such as paper phenol or glass epoxy, and the like. Furthermore, the base body 21 may be formed by coating a surface of a metal plate with an insulator. Furthermore, if the surface of the metal plate is coated by the insulator, the insulator may be formed of the organic material or may be formed of the inorganic material.

If a caloric value of the light emitting element 22 is large, it is preferable that the base body 21 is formed by using the material having high thermal conductivity in terms of heat radiation. For example, as the material having high thermal conductivity, ceramic such as aluminum oxide or aluminum nitride, the high thermal conductivity resin, a material formed by coating the surface of the metal plate with the insulator can be exemplified.

Furthermore, the base body 21 may be a single layer or a multi-layer.

The wiring pattern 24 is provided on at least one main surface of the base body 21.

The wiring pattern 24 can be provided on both main surfaces of the base body 21. In order to reduce manufacturing costs, it is preferable that the wiring pattern 24 is provided on one main surface of the base body 21.

The wiring pattern 24 is provided with an input terminal 24a.

A plurality of input terminals 24a are provided. The input terminal 24a is electrically connected to the power feeding terminal 31 of the power feeding section 30. Thus, the light emitting element 22 is electrically connected to the power feeding section 30 through the wiring pattern 24.

For example, the wiring pattern 24 is formed of a material having silver as the main component. In this case, for example, the wiring pattern 24 is formed of silver or silver alloy. However, the wiring pattern 24 is not limited to the material having silver as the main component and for example, may be formed of a material having copper as the main component.

For example, the wiring pattern 24 may be formed by using a screen printing method.

A plurality of light emitting elements 22 are provided on the wiring pattern 24 provided on the main surface of the base body 21.

The light emitting element 22 can have electrodes (not illustrated) on a surface (upper surface) opposite to a side on which the wiring pattern 24 is provided. Moreover, the electrodes (not illustrated) may be provided on a surface (lower surface) on the side on which the wiring pattern 24 is provided and a surface (upper surface) opposite to the side on which the wiring pattern 24 is provided, or may be provided on only one surface.

The electrodes (not illustrated) provided on the lower surface of the light emitting element 22 are electrically connected to a mounting pad 24b provided in the wiring pattern 24 through a conductive thermosetting material such as silver paste. The electrodes (not illustrated) provided on the upper surface of the light emitting element 22 are electrically connected to a wiring pad 24c provided in the wiring pattern 24 through the wiring 25.

For example, the light emitting element 22 can be a light emitting diode, an organic light emitting diode, a laser diode, and the like.

The upper surface of the light emitting element 22 that is a light emitting surface faces the front side of the lighting device 1 for the moving body and mainly emits the light to the front side of the lighting device 1 for the moving body.

The number, a size, arrangement, and the like of the light emitting element 22 are not limited to the example and can be appropriately changed depending on the size, the usage, and the like of the lighting device 1 for the moving body.

The control element 23 is provided on the wiring pattern 24.

The control element 23 controls a current flowing through the light emitting element 22.

Since there is a variation in forward voltage characteristics of the light emitting element 22, if a voltage applying between an anode terminal and a ground terminal is constant, variation occurs in brightness (luminous flux, luminance, light intensity, and illumination) of the light emitting element 22. Thus, a value of the current flowing through the light emitting element 22 is within a predetermined range by the control element 23 such that the brightness of the light emitting element 22 falls within a predetermined range.

For example, the control element 23 can be a resistor. For example, the control element 23 can be a surface-mounted resistor, a resistor (metal oxide film resistor) having a lead wire, a film-like resistor formed using a screen printing method and the like.

Moreover, the control element 23 illustrated in FIG. 3 is the film-like resistor.

In this case, the value of the current flowing through the light emitting element 22 can be within a predetermined range by changing a resistance value of the control element 23.

For example, if the plurality of control elements 23 are the film-like resistors, a removal section (not illustrated) is formed for each of the plurality of control elements 23 by removing a part thereof. Then, a resistance value is changed for each of the plurality of control elements 23 by a size and the like of the removal section. In this case, if a part of the control element 23 is removed, the resistance value is increased. For example, removal of a part of the control element 23 can be performed by irradiating the control element 23 using laser light.

The number, the size, the arrangement, and the like of the control element 23 are not limited to the exemplary embodiment and can be appropriately changed depending on the number or specification and the like of the light emitting element 22.

The wiring 25 electrically connects the electrodes (not illustrated) provided on the upper surface of the light emitting element 22 and the wiring pad 24c provided in the wiring pattern 24.

For example, the wiring 25 can be a wire having gold as a main component. However, a material of the wiring 25 is not limited to the material having gold as the main component, for example, and may be a material having copper as a main component, or a material having aluminum as a main component.

For example, the wiring 25 electrically connects the electrodes (not illustrated) provided on the upper surface of the light emitting element 22 and the wiring pad 24c provided in the wiring pattern 24 by ultrasonic welding or heat welding. For example, the wiring 25 can electrically connect the electrodes (not illustrated) provided on the upper surface of the light emitting element 22 and the wiring pad 24c provided in the wiring pattern 24 using a wire bonding method.

The surrounding wall member 26 is provided on the base body 21 so as to surround the plurality of light emitting elements 22. For example, the surrounding wall member 26 has a circular shape and is provided such that the plurality of light emitting elements 22 are disposed at a center portion 26a.

For example, the surrounding wall member 26 can be formed of resin such as polybutylene terephthalate (PBT) or polycarbonate (PC), or ceramic, and the like.

Furthermore, if the material of the surrounding wall member 26 is resin, it is possible to improve a reflectance of the light emitted from the light emitting element 22 by mixing particles of titanium oxide and the like.

Moreover, it is not limited to the particles of titanium oxide and particles formed of a material having a high reflectance of the light emitted from the light emitting element 22 may be mixed.

Furthermore, for example, the surrounding wall member 26 can be formed of white resin.

A side wall surface 26b on the side of the center portion 26a of the surrounding wall member 26 is an inclined surface. Some of the light emitted from the light emitting element 22 is reflected on the side wall surface 26b of the surrounding wall member 26 and is emitted to the front side of the lighting device 1 for the moving body.

Furthermore, the light that is a part of the light emitted from the light emitting element 22 to the front side of the lighting device 1 for the moving body and is totally reflected on the upper surface (interface between the sealing section 27 and the outside air) of the sealing section 27 is reflected on the side wall surface 26b on the side of the center portion 26a of the surrounding wall member 26 and is re-emitted to the front side of the lighting device 1 for the moving body.

That is, the surrounding wall member 26 can also have a reflector function. Moreover, a shape of the surrounding wall member 26 is not limited to the example and can be appropriately changed.

The sealing section 27 is provided in the center portion 26a of the surrounding wall member 26. The sealing section 27 is provided to cover the inside of the surrounding wall member 26. That is, the sealing section 27 is provided inside the surrounding wall member 26 and covers the light emitting element 22 and the wiring 25.

The sealing section 27 is formed of a light-transmitting material.

For example, the sealing section 27 can be formed by filling the center portion 26a of the surrounding wall member 26 with a light-transmitting resin. For example, the filling of resin can be performed using a liquid dispensing device such as dispenser.

If the center portion 26a of the surrounding wall member 26 is filled with resin, it is possible to suppress mechanical contact from outside with respect to the wiring pattern 24, the wiring 25, and the like disposed at the light emitting element 22 and the center portion 26a of the surrounding wall member 26.

Here, there is a case where components (for example, packing formed of rubber and the like) containing sulfur are provided in the vicinity of the lighting device 1 for the moving body.

If the components containing sulfur are provided in the vicinity of the lighting device 1 for the moving body, materials of elements provided in the lighting device 1 for the moving body and sulfur react. Thus, there is a concern that electrical connection is inhibited or disconnection occurs.

If the center portion 26a of the surrounding wall member 26 is filled with resin, it is possible to prevent moisture, sulfur, and the like from attaching to the wiring pattern 24, the wiring 25, and the like disposed on the light emitting element 22 and the center portion 26a of the surrounding wall member 26. Thus it is possible to improve reliability of the lighting device 1 for the moving body.

Furthermore, the sealing section 27 can include a phosphor. For example, the phosphor can be a YAG-based phosphor (yttrium-aluminum-garnet-based phosphor).

For example, if the light emitting element 22 is a blue light emitting diode and the phosphor is the YAG-based phosphor, the YAG-based phosphor is excited by the blue light emitted from the light emitting element 22 and yellow fluorescence is emitted from the YAG-based phosphor. Then, white light is emitted from the lighting device 1 for the moving body by mixing blue light and yellow light. Moreover, kinds of phosphor or kinds of the light emitting element 22 are not limited to the example and can be appropriately changed to obtain a desired light emitting color depending on the usage of the lighting device 1 for the moving body.

The adhesive section 28 is bonded to the surrounding wall member 26 and the base body 21.

The adhesive section 28 has a film shape and is provided between the surrounding wall member 26 and the base body 21. For example, the adhesive section 28 can be formed by curing adhesive.

The control element 29 is provided on the wiring pattern 24 through a soldering section 33. That is, the control element 29 is soldered on the wiring pattern 24 on the outside the surrounding wall member 26.

The control element 29 is provided such that a reverse voltage is not applied to the light emitting element 22 and pulse noise is not applied to the light emitting element 22 from a reverse direction.

For example, the control element 29 can be a diode. For example, the control element 29 can be surface-mounted diode, a diode having a lead wire, and the like.

The control element 29 illustrated in FIG. 3 is the surface-mounted diode.

The control element 52 is provided on the wiring pattern 24.

The control element 52 is provided to detect disconnection of the light emitting diode or to prevent erroneous lighting and the like. The control element 52 is a pull-down resistor.

The control element 52 can be a film-like resistor that is formed using the screen printing method and the like.

For example, the control element 52 can be the film-like resistor that is formed using ruthenium oxide.

The coating section 51 is provided to suppress occurrence of migration, to suppress moisture, sulfur, and the like coming into contact with the wiring pattern 24, and to ensure electrical insulation.

The coating section 51 can be formed using a glass material.

If the glass material is used, it is possible to improve reliability with respect to suppression of occurrence of migration and the like.

However, since the glass material is expensive, the coating section 51 is provided to cover a part of the wiring pattern 24.

As described above, for example, the wiring pattern 24 is formed of the material having silver as the main component. Thus, if there is a portion exposed to the wiring pattern 24, there is a concern that migration is generated in the exposed portion. If migration is generated, for example, there is a concern that a short circuit occurs between the facing soldering sections 33.

Furthermore, for example, in a case where the wiring pattern 24 is formed of the material having copper as the main component, if the wiring pattern 24 is used in high-temperature conditions or in an atmosphere in which a sulfur component is large, oxidation or reaction of sulfur may be fast.

Thus, in the embodiment, the exposed portion of the wiring pattern 24 is covered by the coating section 53.

The coating section 53 covers the wiring pattern 24 that is not covered by the coating section 51 outside the surrounding wall member 26.

For example, the coating section 53 can be formed using resin.

The coating section 54 covers the control element 23, the control element 52, and the soldering section 33.

If the coating section 53 and the coating section 54 are close, the coating section 53 and the coating section 54 may be integrated.

If the coating section 54 is provided, moisture, sulfur, and the like can be prevented from coming into contact with the control element 23, the control element 52, and the soldering section 33.

For example, the coating section 54 can be formed using the resin.

In this case, for example, the sealing section 27, the adhesive section 28, the coating section 53, and the coating section 54 can be formed using silicone resin.

The power feeding section 30 is provided with a plurality of power feeding terminals 31.

The plurality of power feeding terminals 31 extend the inside of the housing section 11 and the flange section 12. One end portion of the plurality of power feeding terminals 31 protrudes from the surface of the flange section 12 and is electrically connected to the input terminal 24*a* of the wiring pattern 24. The other end of the plurality of power feeding terminals 31 is exposed from a side of the body section 10 opposite to the side on which the base body 21 is provided.

Moreover, the number, the arrangement, and the shape of the power feeding terminal 31, and the like are not limited to the example and can be appropriately changed.

Furthermore, the power feeding section 30 can include a substrate (not illustrated) and an element such as a capacitor and a resistor. Moreover, for example, the substrate (not illustrated) or the element can be provided inside the housing section 11 and the flange section 12.

The sockets 40 are fitted to end portions of the plurality of power feeding terminals 31 exposed from the body section 10.

The sockets 40 are electrically connected to power supply (not illustrated).

Thus, the power supply (not illustrated) and the light emitting element 22 are electrically connected by fitting the sockets 40 to the end portions of the power feeding terminals 31.

For example, the sockets 40 can be bonded to elements on the body section 10 side using adhesive and the like.

The adhesive section 60 is provided between the base body 21 and the body section 10, and bonds the base body 21 to the body section 10.

The adhesive section 60 covers at least a part of the plurality of connection sections 121.

The adhesive section 60 can be formed by curing the adhesive.

Next, the connection sections 121 will be described. As described above, the connection sections 121 (121*a*, 121*b*, and 121*c*) are provided on the side surface 21*a* of the base body 21.

Figure 4A:
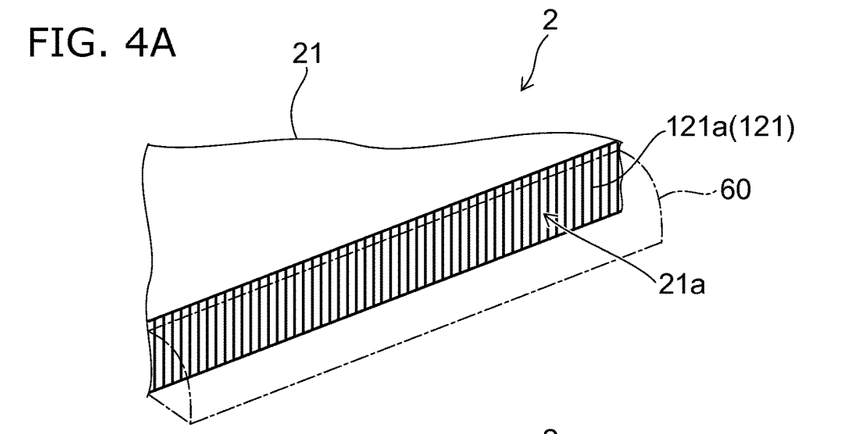
FIGS. 4A to 4C are schematic perspective views illustrating connection sections.
Figure 4B:
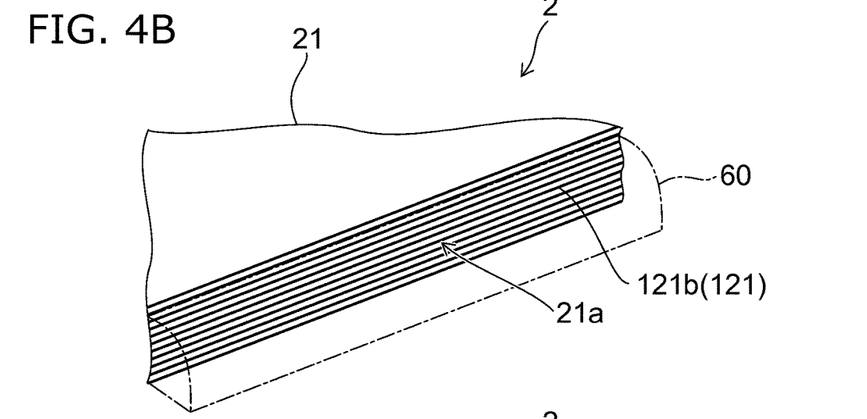
Figure 4C:
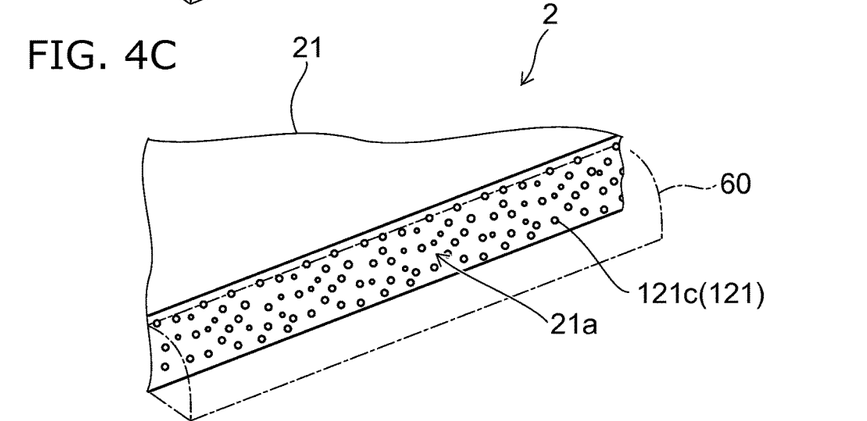

FIGS. 4A to 4C are schematic perspective views illustrating the connection sections 121*a*, 121*b*, and 121*c*.

As illustrated in FIG. 4A, a plurality of connection sections 121a are provided on the side surface 21a of the base body 21 and can be groove sections extending in the thickness direction of the base body 21. The number, a width dimension, a length, a depth, a pitch dimension, and the like of the plurality of connection sections 121a are not specifically limited, and can be appropriately changed depending on dimensions of the side surface 21a, the material of the base body 21, and the like. In this case, the width dimension, the length, the depth, and the pitch dimension of the connection sections 121a provided on each of a plurality of side surfaces 21a may be the same as each other or may be different from each other. Furthermore, the plurality of connection sections 121a may be regularly disposed or may be arbitrarily disposed.

As illustrated in FIG. 4B, a plurality of connection sections 121b are provided on the side surface 21a of the base body 21 and can be groove sections extending in a direction intersecting a thickness direction of the base body 21. The number, a width dimension, a length, a depth, a pitch dimension, and the like of the plurality of connection sections 121b are not specifically limited, and can be appropriately changed depending on the dimensions of the side surface 21a, the material of the base body 21, and the like. In this case, the width dimension, the length, the depth, and the pitch dimension of the connection sections 121b provided on each of the plurality of side surfaces 21a may be the same as each other or may be different from each other. Furthermore, the plurality of connection sections 121b may be regularly disposed or may be arbitrarily disposed.

As illustrated in FIG. 4C, a plurality of connection sections 121c are provided on the side surface 21a of the base body 21 and can be at least one of concave sections and convex sections. That is, the connection sections 121c can be the concave sections, the convex sections, or mixed with the concave sections and the convex sections. Moreover, the connection sections 121c illustrated in FIG. 4C are a case of the concave sections. The number, a cross sectional dimension, a shape, a depth, a pitch dimension, and the like of the plurality of connection sections 121c are not specifically limited, and can be appropriately changed depending on dimensions of the side surface 21a, the material of the base body 21, and the like. In this case, the number, the cross sectional dimension, the shape, the depth, and the pitch dimension of the connection sections 121c provided on each of the plurality of side surfaces 21a may be the same as each other or may be different from each other. Furthermore, the plurality of connection sections 121c may be regularly disposed or may be arbitrarily disposed.

Furthermore, a forming method of the connection sections 121 (121a, 121b, and 121c) is also not specifically limited and can be appropriately selected depending on the material of the base body 21 and the like.

Furthermore, the plurality of side surfaces 21a of the base body 21 are provided, but the connection sections 121 (121a, 121b, and 121c) may be provided on at least one of the side surfaces 21a.

Here, it is possible to increase the adhesion strength between the substrate 2 and the body section 10 as the number of the side surfaces 21a on which the connection sections 121 (121a, 121b, and 121c) are provided is increased.

Meanwhile, the manufacturing costs are increased as the number of the side surfaces 21a on which the connection sections 121 (121a, 121b, and 121c) are provided is increased.

Thus, it is preferable that the connection sections 121 (121a, 121b, and 121c) are provided on each of a pair of facing side surface 21a. If the connection sections 121 (121a, 121b, and 121c) are provided on each of the pair of facing side surface 21a, it is possible to equal the adhesive force at symmetrical positions with respect to the center of the substrate 2.

As a result, even if the number of side surfaces 21a on which the connection sections 121 (121a, 121b, and 121c) are provided is reduced, it is possible to maintain a resistance force against the vibration and thermal stress.

If the connection sections 121 (121a, 121b, and 121c) are provided, it is possible to increase a contact area between the base body 21 and the adhesive section 60. If the contact area can be increased, a physical bonding such as van der Waals force or a chemical bonding can be increased. Thus, it is possible to improve adhesion strength between the substrate 2 and the body section 10.

Furthermore, since a part of the adhesive section 60 can enter the inside of the connection sections 121 (121a, 121b, and 121c), it is possible to increase mechanical connection. Thus, it is possible to improve the adhesion strength between the substrate 2 and the body section 10.

Figure 5A:
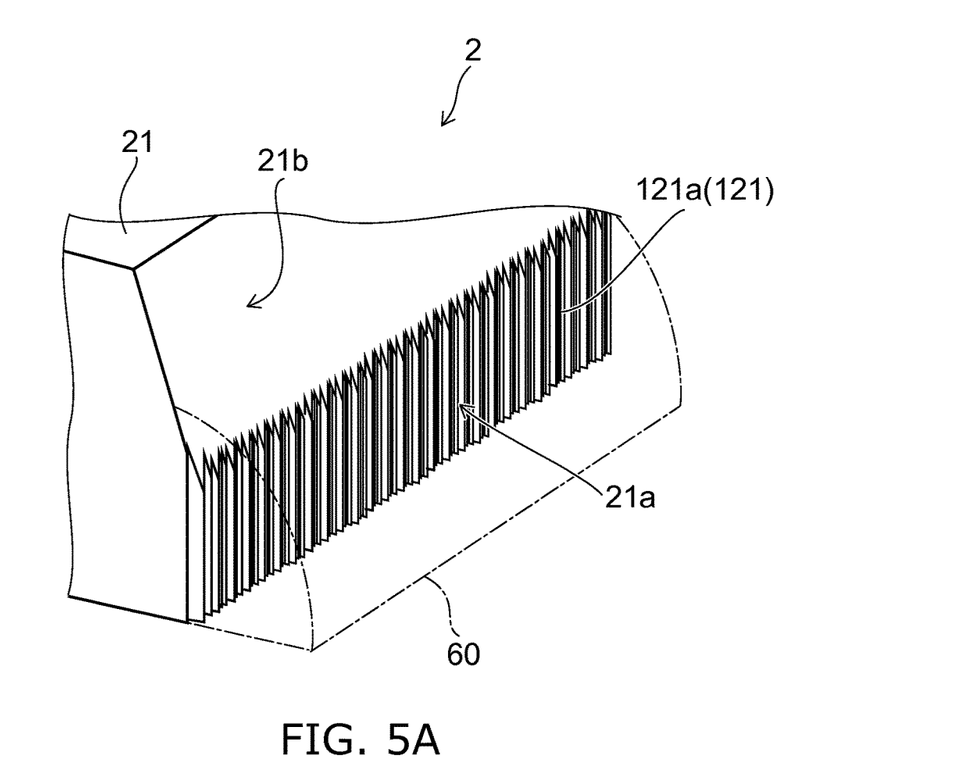
FIG. 5A is a schematic perspective view illustrating the connection section and an inclined surface.

FIG. 5A is a schematic perspective view illustrating the connection section 121a and the inclined surface 21b.

Figure 5B:
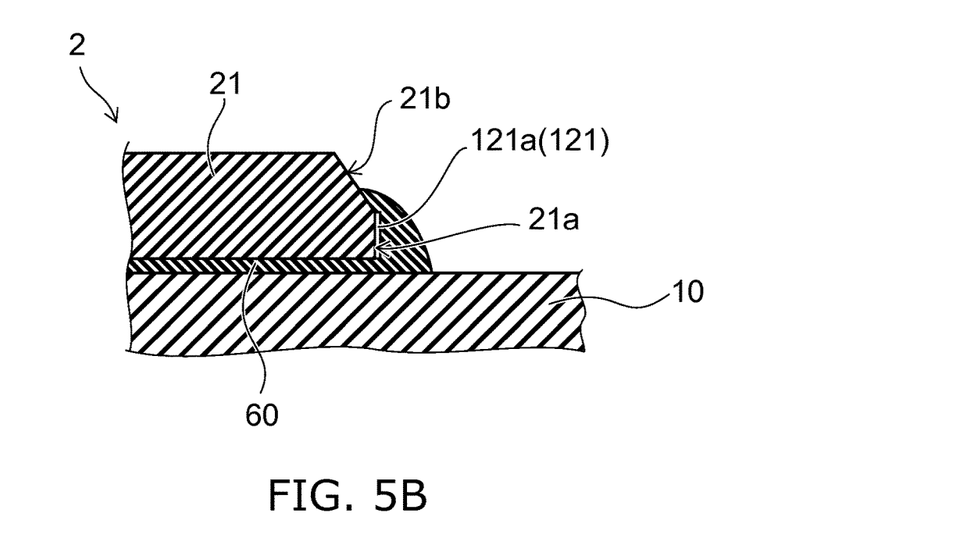
FIG. 5B is a schematic cross-sectional view illustrating a relationship between an adhesive section and the inclined surface.

FIG. 5B is a schematic cross-sectional view illustrating a relationship between the adhesive section 60 and the inclined surface 21b.

As illustrated in FIGS. 5A and 5B, one end of the inclined surface 21b is connected to the main surface on the side of the base body 21 on which the light emitting element 22 is provided. The other end of the inclined surface 21b is connected to the side surface 21a.

The inclined surface 21b is inclined in a direction close to the center of the base body 21 as the inclined surface 21b goes toward the side of the base body 21 on which the light emitting elements 22 are provided.

As illustrated in FIGS. 5A and 5B, it is preferable that at least a part of the inclined surface 21b is covered by the adhesive section 60. In this case, an entire surface of the inclined surface 21b can be also covered by the adhesive section 60.

If at least a part of the inclined surface 21b is covered by the adhesive section 60, it is possible to increase a resistance force against a force to peel the substrate 2 upward.

An inclined angle of the inclined surface 21b is not specifically limited and can be appropriately changed depending on the thickness dimension, the material, ease of processing, and the like of the base body 21.

A forming method of the inclined surface 21b is also not specifically limited and can be appropriately selected depending on the material and the like of the base body 21.

Here, it is possible to increase the resistance force against the force to peel the substrate 2 upward as the number of the inclined surfaces 21b is increased.

Meanwhile, the manufacturing costs are increased as the number of the inclined surfaces 21b is increased.

Thus, it is preferable that a pair of facing inclined surface 21b is provided.

If the pair of facing inclined surface 21b are provided, it is possible to equal the resistance force against the force to peel the substrate 2 upward at symmetrical positions with respect to the center of the substrate 2.

As a result, even if the number of inclined surfaces 21b is reduced, it is possible to maintain the resistance force against the vibration and thermal stress.

In this case, it is preferable that the pair of the inclined surfaces 21b are provided above the pair of side surface 21a on which the connection sections 121 (121a, 121b, and 121c) are provided.

In this case, it is possible to further suppress peeling of the substrate 2.

Moreover, in FIGS. 5A and 5B, a case where the connection sections 121a are provided is illustrated, but the connection sections 121b and 121c may be provided.

Furthermore, the connection sections 121 (121a, 121b, and 121c) may be also provided in the inclined surface 21b.

Figure 6A:
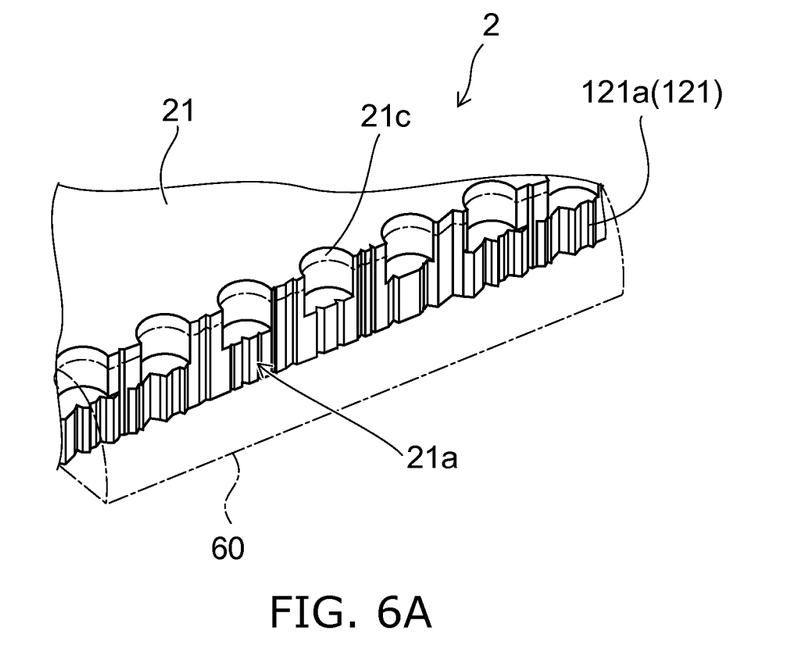
FIG. 6A is a schematic perspective view illustrating the connection section and a concave section.

FIG. 6A is a schematic perspective view illustrating the connection section 121a and the concave section 21c.

Figure 6B:
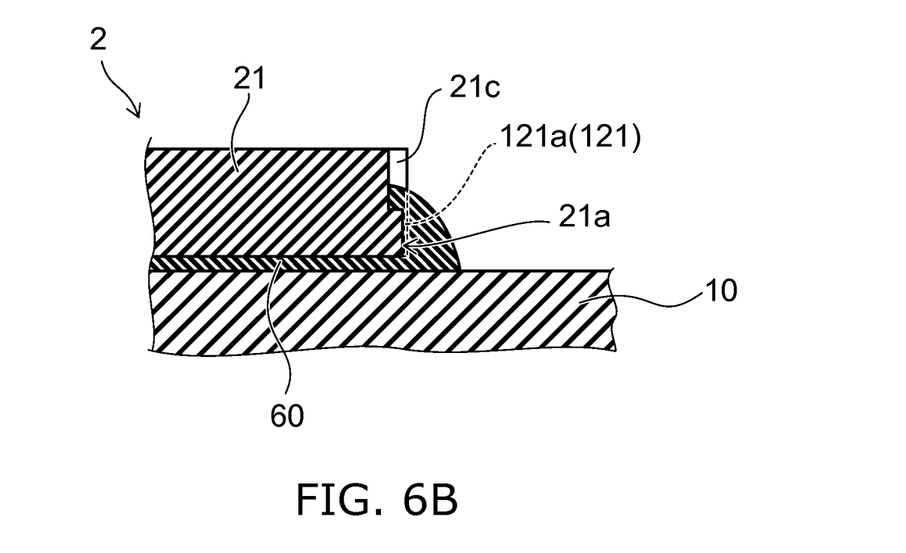
FIG. 6B is a schematic cross-sectional view illustrating a relationship between the adhesive section and the concave section.

FIG. 6B is a schematic cross-sectional view illustrating a relationship between an adhesive section 60 and the concave section 21c.

As illustrated in FIGS. 6A and 6B, a plurality of concave sections 21c can be provided on a periphery of the base body 21.

The concave sections 21c open to the main surface on the side of the base body 21 on which the light emitting element 22 is provided and the side surface 21a.

As illustrated in FIGS. 6A and 6B, it is preferable that the adhesive section 60 enters at least a part of the plurality of concave sections 21c. In this case, the adhesive section 60 can enter the inside of entire concave sections 21c.

If the adhesive section 60 enters at least a part of the plurality of concave sections 21c, it is possible to increase the resistance force against the force to peel the substrate 2 upward.

The number, a cross sectional dimension, a shape, a depth, a pitch dimension, and the like of the plurality of concave sections 21c are not specifically limited, and can be appropriately changed depending on dimensions and the material of the base body 21, and the like.

In this case, the number, the cross sectional dimension, the shape, the depth, and the pitch dimension of the concave sections 21c opening to each of the plurality of side surfaces 21a may be the same as each other or may be different from each other. Furthermore, the plurality of concave sections 21c may be regularly disposed or may be arbitrarily disposed.

A forming method of the concave section 21c is also not specifically limited and can be appropriately selected depending on the material and the like of the base body 21.

Here, it is possible to increase the resistance force against the force to peel the substrate 2 upward as the number of the concave sections 21c is increased.

Meanwhile, the manufacturing costs are increased as the number of the concave sections 21c is increased.

Thus, it is preferable that the concave sections 21c opening to the pair of facing side surface 21a are provided.

If the concave sections 21c opening to the pair of facing side surface 21a are provided, it is possible to equal the resistance force against the force to peel the substrate 2 upward at symmetrical positions with respect to the center of the substrate 2.

As a result, even if the number of the concave sections 21c is reduced, it is possible to maintain the resistance force against the vibration and thermal stress.

In this case, it is preferable that the concave sections 21c open to the pair of the side surfaces 21a on which the connection sections 121 (121a, 121b, and 121c) are provided.

In this case, it is possible to further suppress peeling of the substrate 2.

Moreover, in FIGS. 6A and 6B, a case where the connection sections 121a are provided is illustrated, but the connection sections 121b and 121c may be provided.

Furthermore, the connection sections 121 (121a, 121b, and 121c) may be also provided in the concave section 21c.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Moreover, above-mentioned embodiments can be combined mutually and can be carried out.

What is claimed is:

1. A lighting device for a moving body comprising:
a body section;
a substrate that is provided on the body section, the substrate including a base body having a plurality of connection sections on a side surface and a wiring pattern provided on at least one main surface of the base body;
a light emitting element that is electrically connected to the wiring pattern; and
an adhesive section that is provided between the base body and the body section,
wherein the connection sections are groove sections extending in a thickness direction of the base body, the connection sections are different from one another in width, length, depth and pitch, and
wherein the adhesive section covers at least a part of the plurality of connection sections.

2. The device according to claim 1,
wherein the plurality of connection sections are provided on each of a pair of facing side surfaces.

3. The device according to claim 1,
wherein the base body further has an inclined surface of which one end portion is connected to the main surface of the base body on which the light emitting element is provided, the other end is connected to the side surface, the inclined surface being inclined in a direction such that the inclined surface becomes closer to a center of the base body as the inclined surface approaches a side of the base body on which the light emitting element is provided, and
wherein the adhesive section covers at least a part of the inclined surface.

4. The device according to claim 3,
wherein a pair of inclined surfaces are provided to face each other.

5. The device according to claim 3,
wherein the plurality of connection sections are also provided on the inclined surface.

6. The device according to claim 1,
wherein the base body further has a plurality of concave sections opening to the main surface on a side of the base body on which the light emitting element is provided and to the side surface, and
wherein the adhesive section enters at least a part of the plurality of concave sections.

7. The device according to claim 6,
wherein the plurality of concave sections open to each of a pair of facing side surfaces.

8. The device according to claim 1,
wherein a material of the base body is an inorganic material.
9. The device according to claim 1,
wherein a material of the base body is a ceramic.
10. The device according to claim 1,
wherein the base body has a metal plate and an insulator covering a surface of the metal plate.
11. The device according to claim 1,
wherein the light emitting element is one of a light emitting diode, an organic light emitting diode, and a laser diode.
12. The device according to claim 1,
wherein the wiring pattern includes silver.
13. The device according to claim 1, further comprising:
a coating section that covers a part of the wiring pattern.
14. The device according to claim 13,
wherein a material of the coating section is a glass material.
15. The device according to claim 1,
wherein the body section has a flange section,
wherein one surface of the flange section is provided with the base body through the adhesive section, and
wherein the other surface of the flange section is provided with a plurality of fins.
16. The device according to claim 1,
wherein a material of the body section is a high thermal conductivity resin.
17. The device according to claim 1, further comprising:
a surrounding wall member that surrounds the light emitting element and is provided on the base body.
18. The device according to claim 17,
wherein a sealing section covering the light emitting element is provided inside the surrounding wall member.

* * * * *